United States Patent [19]

Kumasaka et al.

[11] Patent Number: 5,942,012
[45] Date of Patent: Aug. 24, 1999

[54] HEAT TREATMENT APPARATUS

[75] Inventors: Iwao Kumasaka, Kanagawa-Ken; Yuichi Higuchi, Morioka, both of Japan

[73] Assignee: Tokyo Electron Limited, Tokyo-to, Japan

[21] Appl. No.: 08/663,030

[22] Filed: Jun. 7, 1996

[30] Foreign Application Priority Data

Jun. 9, 1995 [JP] Japan .................................... 7-168156
Jun. 23, 1995 [JP] Japan .................................... 7-180705

[51] Int. Cl.$^6$ .................................................... H01L 21/68
[52] U.S. Cl. ........................................................ 29/25.01
[58] Field of Search ............................................ 29/25.01

[56] References Cited

U.S. PATENT DOCUMENTS

| | | |
|---|---|---|
| 4,938,655 | 7/1990 | Asano . |
| 5,273,244 | 12/1993 | Ono . |
| 5,423,503 | 6/1995 | Tanaka et al. . |
| 5,662,469 | 9/1997 | Okase et al. . |

*Primary Examiner*—David Graybill
*Attorney, Agent, or Firm*—Smith, Gambrell & Russell, LLP; Beveridge, DeGrandi, Weilacher & Young Intellectual Property Group

[57] ABSTRACT

One lot is a group of wafers-to-be-processed in one wafer carrier, and one lot region for one lot is allocated fixed to a holding region of a wafer boat. A variable lot region mode in which lot regions for 4, for example, lots are allocated to the wafer boat. When a lot number is less than 4, or numbers of sheets of wafers-to-be-processed in the respective lots are less than a prescribed number, the lot regions can be compressed, centered on a number of a set holding groove is prepared. On the other hand, in connection with transfer of monitor wafers, a mode in which monitor wafers are transferred to inter-lot regions, and a mode in which numbers of holding grooves can be designated are prepared. The former mode is selected in product monitor, and the latter mode is selected in apparatus monitor. The fixed lot region mode in which the respective lots correspond to their holding regions irrespective of numbers of sheets of wafers in the carriers, and the variable lot region mode in which wafers-to-be-processed are transferred to both sides of a designated number of holding groove can be selected by switches. The fixed lot region mode includes a first fixed lot region mode in which wafers-to-be-processed are held in the same arrangement as in the respective carriers, and a second fixed lot region in which wafers-to-be-processed are held without a vacant stage therebetween in respective lot regions. According to the present invention, because of the above-described constitutions, a heat treatment apparatus for heat treating a number of semiconductor wafers, for example, a vertical heat treatment apparatus, can have high freedom degree in arranging wafers-to-be-processed in the wafer boat, and the semiconductor wafers can be transferred suitably in accordance with kinds of heat treatments.

6 Claims, 12 Drawing Sheets

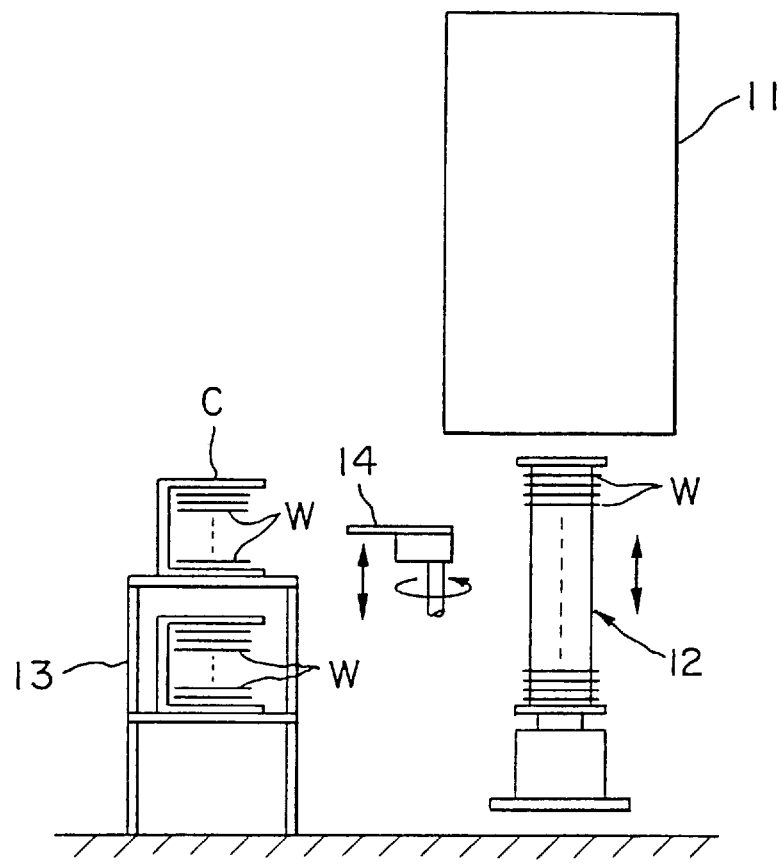
FIG. 14 - Prior Art
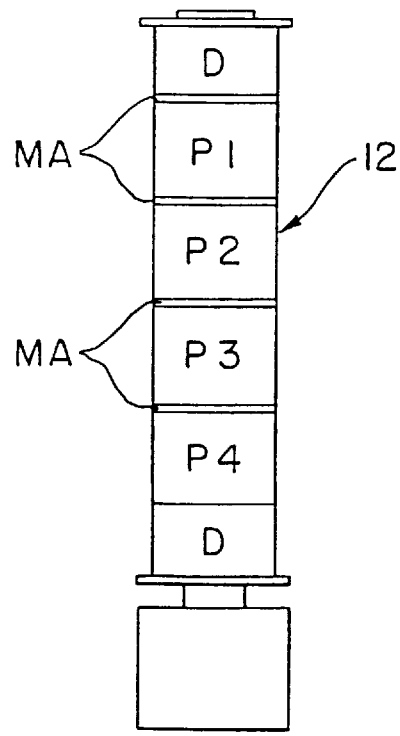
FIG. 15
Prior Art

HEAT TREATMENT APPARATUS

BACKGROUND OF THE INVENTION

The present invention relates to a heat treatment apparatus for objects to be processed.

Processing of semiconductor wafers, objects to be processed, includes heat treatment steps as important ones of the steps of the processing. The heat treatments are for, e.g., formation of oxide films on the objects to be processed, diffusion of dopants, annealing, CVD, etc. Recently vertical heat treatment apparatuses are dominantly used in place of horizontal heat treatment apparatuses because of the advantage of the former that air intrusion onto the surfaces of the objects to be processed is less.

As shown in FIG. 14, the vertical heat treatment apparatus of this kind includes a vertical heat treatment furnace 11, a wafer boat 12 as a wafer holder which holds a number of wafers W arranged in a shelves-like manner at a vertical pitch, a transfer stage 13 on which a wafer carrier C (hereinafter called "carrier") to transfer the wafers W, a loading/unloading port for the carrier C; a carrier stocker, etc. The wafers W in the carrier mounted on the transfer stage 13 are transferred to the wafer boat 12 by a transfer arm 14. After a required number of wafers are mounted on the wafer boat 12, the wafer boat 12 is lifted into the heat treatment furnace 11 by a boat elevator, and a required heat treatment is conducted on the wafers W in the heat treatment furnace 11.

Because of the structure of the heat treatment furnace, the upper and lower end portions of the wafer boat 12 have lower temperatures than the rest of the wafer boat 12. To prevent inhomogeneous treatment among the wafers W, dummy wafers are placed at the upper and the lower parts of the wafer boat 12, and proper wafers are placed except at the upper and the lower end parts. As shown in FIG. 15, the wafers-to-be-processed holding region of the wafer boat 12 has lot regions P1–P4 for 4 lots each of which can include, e.g., 25 sheets of wafers. For example, in a case that wafers to be processed are transferred from 4 carriers onto the wafer boat 12, the wafers in each carrier are transferred to each lot region P1–P4. In FIG. 15, D represents dummy wafer holding regions.

On the other hand, to monitor states of a treatment conducted on the wafers-to-be-processed in each lot, product monitor wafers are heat-treated together with the wafers-to-be-processed in the lot. Product monitor wafers are stored in a carrier in the carrier stocker of, e.g., the heat treatment apparatus and are taken out of the carrier to be transferred to between the respective lot regions P1–P4 (including the holding position which is upper of the lot region P1 by one stage) in the wafer boat 12.

When product monitor wafers are used, a product monitor wafer mode switch on an operation panel of the heat treatment is pressed to transfer product monitor wafers to between the lot regions P1–P4. In this case, in the wafer holding region P1–P4 wafers to be processed are held, and product monitor wafers are held in between the lot regions P1–P4 (in the regions MA indicated by the double lines in FIG. 15). When a number of wafers in one carrier is less than 25 sheets, a lacking number of wafers is not supplemented (holding grooves of the wafer boat are left unfilled), or a lacking number of wafers is added to fill all the holding grooves.

Here, in a heat treatment apparatus with a wafer boat which can hold wafers of, e.g., four carriers, sometimes in one operation of processing, all four carriers are not used, or a number of wafers in one carrier is less than 25 sheets. In these cases, it is advantageous that the lot regions are not fixed with respect to the carriers, and those of the lot regions where the apparatus exhibits good characteristics, e.g., better intra-surface uniformity of a heating temperature are used. To this end, the inventors of the present invention proposed that when one of the holding grooves of the wafer boat is designated, all objects-to-be-processed of one batch are held in those holding grooves concentratedly (without empty ones), which are upper and lower of the designated holding groove, whereby higher freedom in degree of selection of holding positions of wafers, objects to be processed can be realized.

The heat treatment apparatus does not have always stable states and often deteriorates suddenly or gradually treatment conditions. To continue useless treatments or pause the device in normal operations, it is important to monitor states of the heat treatment apparatus. Generally it is not necessary to use product monitor wafers for every treatment when the heat treatment apparatus is sufficiently stable, and it suffice to use product monitor wafers once for several treatments. In view of this, the inventors have proposed using monitor wafers in the monitor wafer carrier as apparatus monitor wafers. The apparatus monitor wafers, however, are for checking states of the apparatus and reference levels about film thickness intra-surface uniformity and particle numbers for the apparatus monitor wafers are different from those for the product monitor wafers. Accordingly the apparatus monitor wafers are sent, after a heat treatment, to inspection steps which are different from those for the product monitor wafers.

Preferably the apparatus monitor wafers for thus monitoring states of the heat treatment apparatus are treated at set positions in a heating furnace, i.e., are held in set holding grooves of the wafer boat. In the conventional case that the lot regions are fixed, switches for, e.g., those P1, P4 of the lot regions P1–P4 on the operational panel are pressed to the apparatus monitor wafers are held in the holding grooves immediately one-stage upper of the lot regions P1, P4, whereby the apparatus can be monitored always at the set positions. In the case of the mode the inventors have proposed, when a number of wafers to be processed for one batch is smaller than a capacity number, the apparatus monitor wafers are arranged concentratedly in those of the holding grooves without empty ones in those holding grooves, a region for holding wafers-to-be-processed of one lot is varied. The conventional positioning of the monitor wafers cannot set holding locations of the apparatus monitor wafers, and as a result, disadvantageously monitored results of the apparatus are less reliable.

SUMMARY OF THE INVENTION

The present invention was made in view of these disadvantages. An object of the present invention is to provide a heat treatment apparatus having high freedom degree of operation. Another object of the preset invention is to provide a heat treatment apparatus whose states can be monitored with high reliability.

The heat treatment apparatus according to the present invention for holding a plurality of substrates-to-be-processed in holding means side by side in a unit of lot while taking out monitor substrates out of an exclusive storing unit by transfer means and transferring the monitor substrates to the holding means, loading the holding means into a reaction tube of a heating furnace to make a heat treatment on the monitor substrates concurrently with the substrates to be processed, the heat treatment apparatus comprises:

a monitor substrate transfer mode selecting unit for setting a relative position designating mode and an absolute position designating mode and selecting either of the modes, the relative position designating mode being for allocating lot regions which are substrate holding regions of lots of one batch processing to a substrate holding region of the holding means, and designating relative positions for monitor substrates, based on the lot regions, and holding the monitor substrates there, the absolute position designating mode being for designating ordinal numbers of stages in the substrate holding region of the holding means and holding the monitor substrates there, a relative position designating unit for designating holding positions of the monitor substrates corresponding to the lot regions when the relative position designating mode is selected; and an absolute position designating unit for designating ordinal numbers of stages of holding positions of the monitor substrates when the absolute position designating mode is selected.

The heat treatment apparatus according to the present invention for holding a plurality of substrates-to-be-processed in holding means side by side in a unit of lot while taking out monitor substrates out of an exclusive storing unit by transfer means and transferring the same to the holding means, loading the holding means into a reaction tube of a heating furnace to make a heat treatment on the monitor substrates concurrently with the substrates to be processed, the heat treatment apparatus comprises:

a substrate-to-be-processed transfer mode selecting unit for setting a fixed lot region mode and a variable lot region mode, and selecting either of the modes, the fixed lot region mode being for allocating lot regions for respective lots to a substrate holding region of the holding means, and transferring substrates-to-be-processed of the respective lots to the associated lot regions, the variable lot region mode being for designating an ordinal number of a stage in the substrate holding region of the holding means as a standard position, and transferring the substrates-to-be-processed of all the lots involved in one batch processing to the holding means without a vacant stage therebetween;

a monitor substrate transfer mode selecting unit for setting a relative position designating mode and an absolute position designating mode, and selecting either of the modes, the relative position designating mode being for designating relative positions based on the lot regions, and holding monitor substrates there, the absolute position designating mode being for designating ordinal numbers of stages of holding positions in the holding region of the holding means;

a relative position designating unit for designating the lot regions to which the holding positions of the monitor substrates correspond, when the relative position designating mode is selected; and an absolute position designating unit for designating ordinal numbers of stages of the holding positions of the monitor substrates when the absolute position designating mode is selected.

According to the present invention, in a case that substrates-to-be-processed, e.g., wafers, for 4 lots are transferred to the holding means (wafer boat) which can hold, for example, 4 lots of wafers at maximum, when the fixed lot region mode is selected, the wafers-to-be-processed in a first lot are transferred to a preset lot region, e.g., the uppermost lot region except a holding region for dummy wafers, and the wafers-to-be-processed in a second lot and the following lots are transferred respectively to the lot regions below the uppermost lot region. Then, when product monitor wafers or apparatus monitor wafers are used, and the relative position designating mode, e.g., the inter-lot region designating mode is selected, the product monitor wafers or the apparatus monitor wafers are transferred to the inter-lot regions (the region upper of the first lot is included by the "inter-lot regions" in the present invention), and are used to monitor treated states of the wafers-to-be-treated of the respective lots, and apparatus states.

On the other hand, in a case that the variable lot region mode is selected for 2, for example, lots of heat treatment, all wafers-to-be-processed of the two lots are arranged concentrated, e.g., on both sides of a standard position in the wafer holding region of the holding means. In this case, when apparatus monitor wafers are used, the absolute position designating mode is selected, whereby the apparatus monitor wafers can be held at the same holding position as before, e.g., the position immediately above the first lot region to which wafers-to-be-processed have been transferred in the fixed lot region mode. Thus, the transfer mode for wafers-to-be-processed has a high degree freedom while apparatus monitor wafers can be heat treated always at the same position.

BRIEF DESCRIPTION OF THE DRAWINGS

FIG. 14 is a side view of a conventional vertical heat treatment apparatus, which shows its schematic structure.

FIG. 15 is an explanatory view of a wafer holding region and monitor wafer holding regions of a wafer boat used in the conventional vertical heat treatment apparatus.

DETAILED DESCRIPTION OF PREFERRED EMBODIMENTS

A First Embodiment

Figure 1:
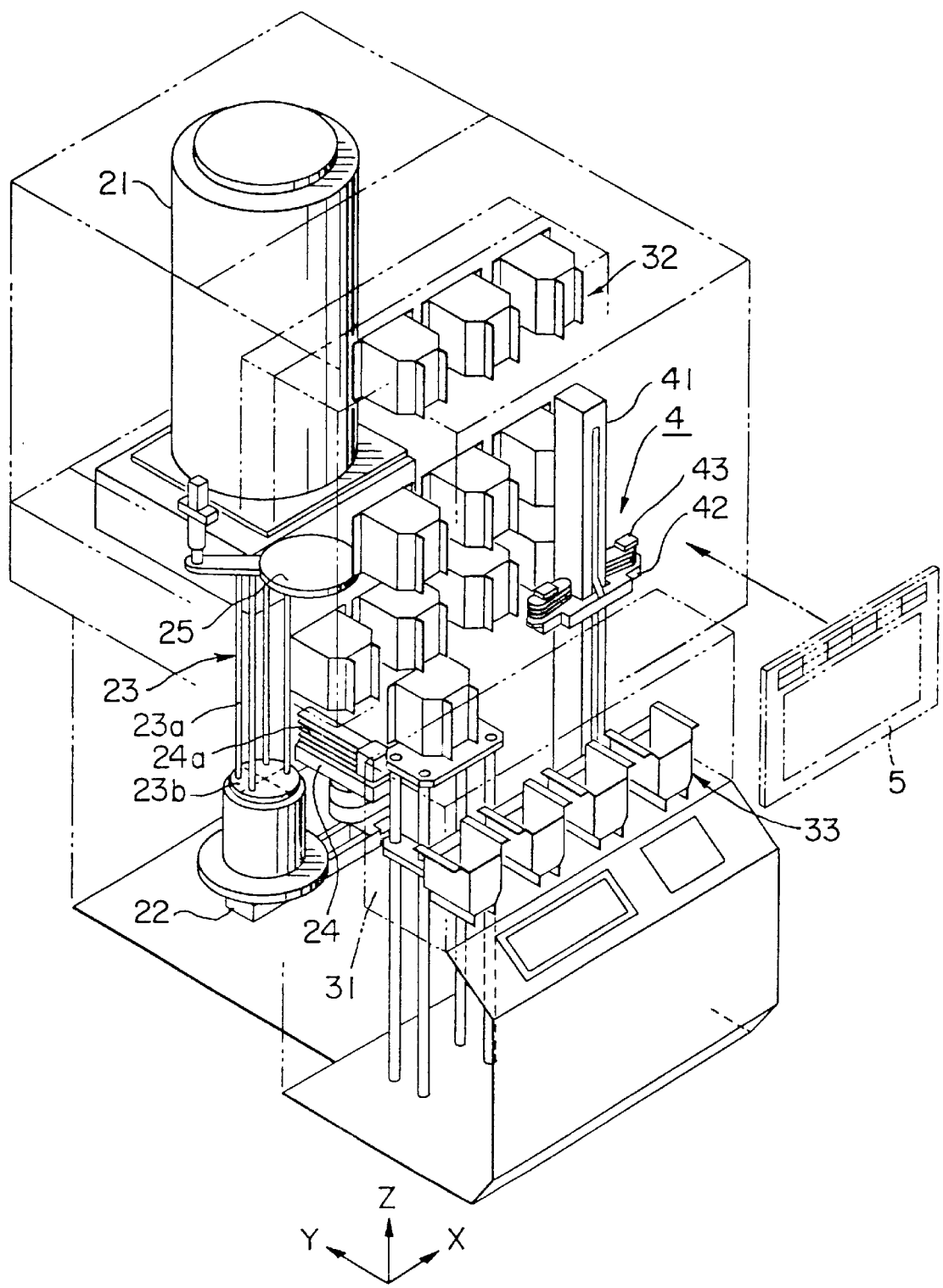
FIG. 1 is a general perspective view of the heat treatment apparatus according to a first embodiment of the present invention.
Figure 2:
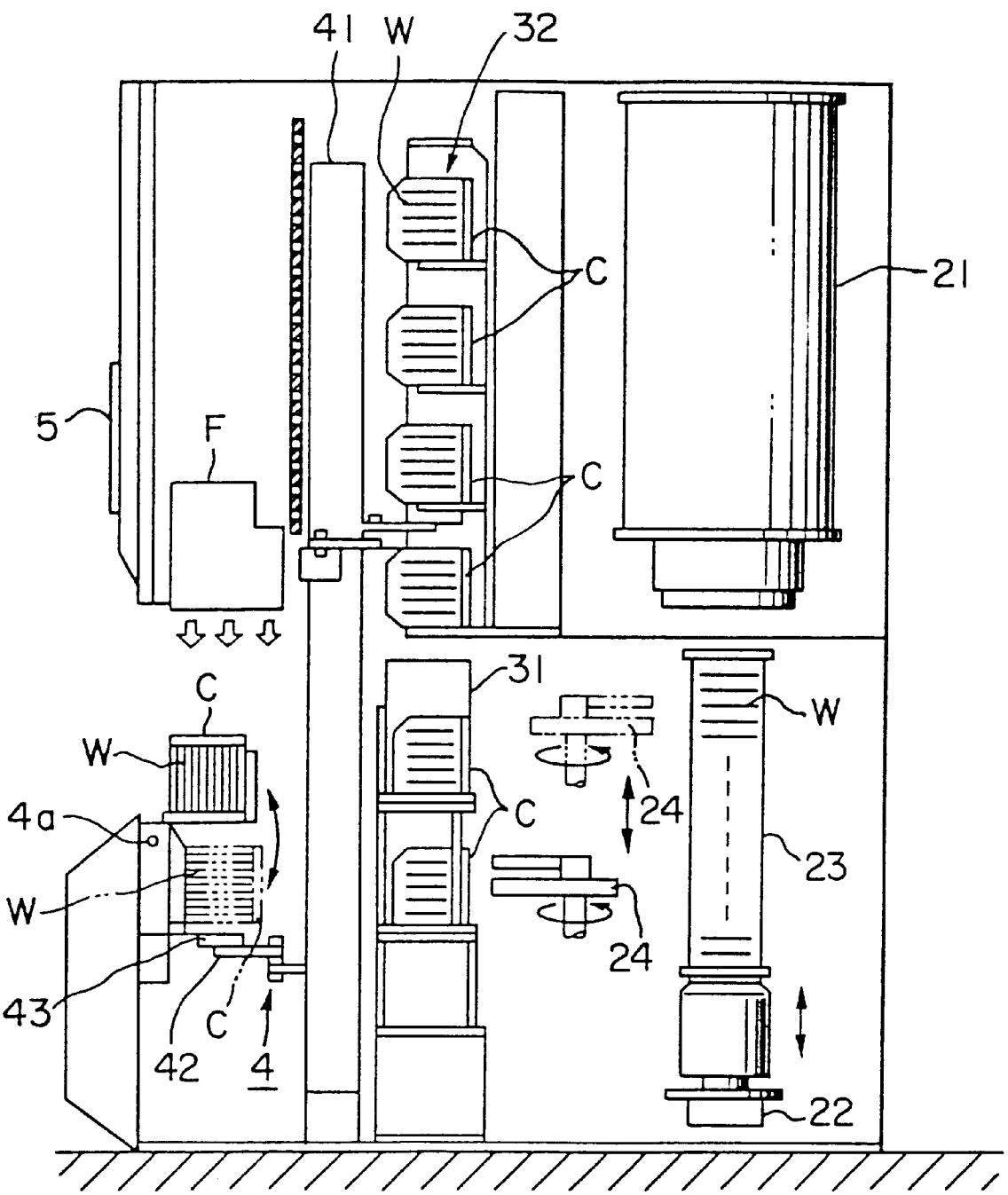
FIG. 2 is a general vertical sectional view of the heat treatment apparatus shown in FIG. 1.

FIGS. 1 and 2 shows the heat treatment apparatus according to a first embodiment of the present invention. The heat treatment apparatus comprises, at an inner part of the apparatus, a vertical heat treatment furnace 21 including a reaction tube and a heater surrounding the reaction tube which are not shown, a wafer boat 23 which holds a number of objects (wafers) to be processed, e.g., wafers horizontal at a vertical certain pitch and which is loaded/unloaded the wafers into the heat treatment furnace 21 by a boat elevator 22, and a wafer transfer mechanism 24 including, e.g., pincettes which are retractable, movable up and down, and rotatable.

As shown in FIG. 1, the wafer boat 23 includes four support bars 23a of, e.g., quartz implanted in a bottom plate 23 thereof along the wafer contour, and holding grooves formed in the respective support bars 23a at corresponding height levels for supporting peripheral parts of the wafers. The wafer transfer mechanism 24 comprises, e.g., 5 pincettes 24a for carrying 5 sheets wafers at once. One of the pincettes 24a is retractable independently of the remaining four pincettes 24a to carry one sheet of wafer. In FIG. 1, reference numeral 25 represents a cap which is turned to close and seal the bottom opening of the heat treatment furnace 21 during transfer of wafers between the wafer boat 23 and carriers C. A wafer transfer stage 31 is disposed opposed to a lower position of the wafer boat 23 through the wafer transfer mechanism 24. The wafer transfer stage 31 can accommodate the carriers C holding wafers W on three, for example, vertical stages.

In a region above the wafer transfer stage 31 there is provided a carrier storing shelf 32 (the so-called "carrier stocker"). The carrier storing shelf 32 can accommodate, e.g., 16 carriers at most in 4 rows and 4 stages. The carriers C stored on the carrier storing shelf 32 are carriers holding wafers to be processed, carriers holding dummy wafers, carriers holding supplemental wafers and carriers holding monitor wafers.

A region where the carrier transfer mechanism 4 is secured at a position opposed to the wafer transfer stage 31 and the carrier storing shelf 32. Carrier stages 33 are provided in front of the apparatus as viewed in FIG. 1, with the movement region therebetween. The carrier stages 33 function as an inlet/outlet port through which the carriers C holding wafers are loaded from and unloaded into the outside. Four, for example, carriers C are held in a horizontal row (in the X direction) with the wafer outlet ports faced upward, i.e., in their upright state.

The carrier stages 33 are conceptionally shown by one stage, but actually are for the respective carriers C. The carrier stages 33 include a mechanism by which the carrier stages 33 are turned inward on a horizontal pin 4a to be rested on one side, and are transferred by a carrier mechanism, rested on one side. The carrier transfer mechanism 4 includes an arm 43 which is rotatable in the Z direction to hold and transfer the carriers C and mounted on a lift table 42 which is movable up and down along a support bar 41 in the X direction. In FIG. 2, F represents an air filter. As shown in FIGS. 1 and 2, a touch panel 5 for operation of the apparatus is mounted on the front panel of the apparatus body. The touch panel 5 functions as an operational portion and a display portion.

Figure 3:
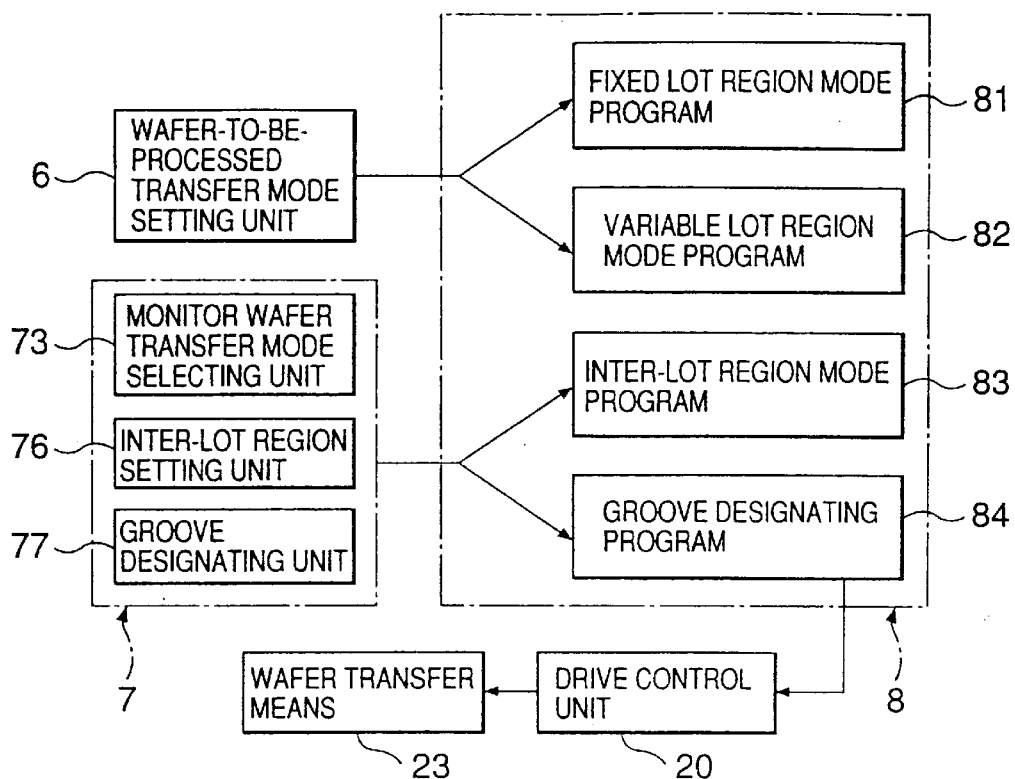
FIG. 3 is a block diagram of a wafer transfer mode setting unit of the heat treatment apparatus shown in FIG. 1.

As shown in FIG. 3, the heat treatment apparatus according to the first embodiment comprises a wafer-to-be-processed transfer mode setting unit which sets in what arrangement wafers to be processed are transferred to the wafer boat 23, a monitor wafer transfer mode setting unit 7 for setting in what arrangement monitor wafers are transferred to the wafer boat 23, a storing unit 8 which stores a program for setting a procedure of transfer of wafers to be processed and monitor wafers, and a drive control unit 20 which controls drive of the wafer transfer mechanism 24, based on the program stored in the storing unit 8. FIG. 3, however, shows only a major part, and actually the control system includes a central processing unit, bus lines, etc. In the present embodiment the transfer mode setting units 6, 7 are provided by an operational display on the touch panel 5.

Figure 4:
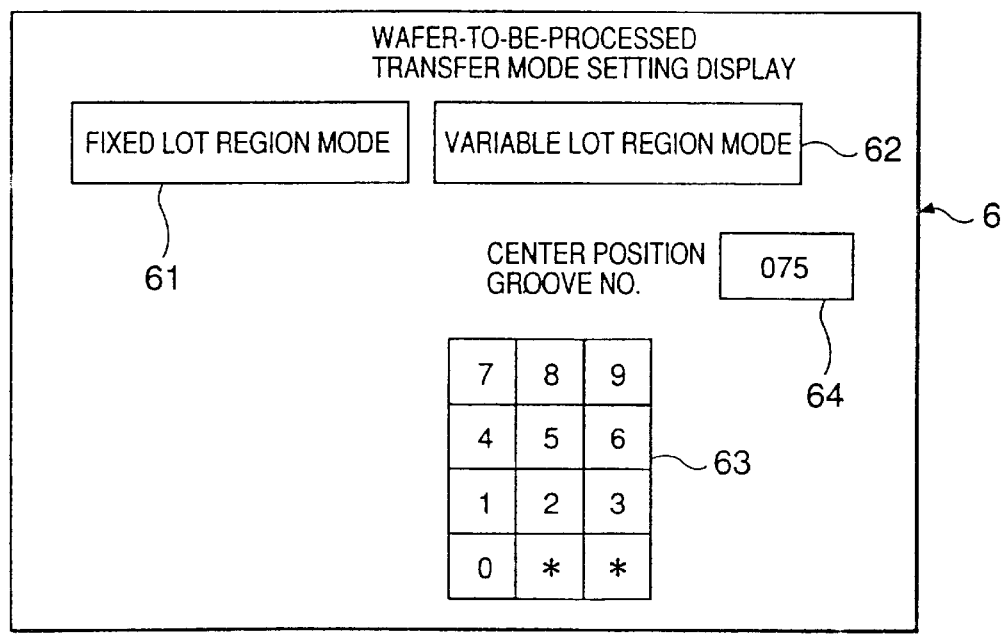
FIG. 4 is a wafer-to-be-processed transfer mode setting display of the heat treatment apparatus shown in FIG. 1.

FIG. 4 shows one example of the operational display corresponding to the wafer-to-be-processed transfer mode setting unit 6. The wafers-to-be-processed transfer mode setting unit 6 includes a switch 61 for selecting a fixed lot region mode, and a switch 62 for selecting a variable lot region mode. The fixed lot region mode is for transferring wafers-to-be-processed of respective lots to lot regions of a wafer holding region of the wafer boat, which are allocated to the respective lots. For example, in a case that the wafer boat 23 has 150 stages of holding grooves, dummy wafers are held on 23 stages from the top and on 23 stages from the top, and wafers to be processed are held (on 104 stages) between the upper and the lower dummy wafers, in FIG. 15, 4 sections each including 25 stages respectively correspond to lot regions P1–P4, and even when a number of wafers in the carrier associated with one lot is 25 sheets or smaller than 24 sheets, the wafers of the one carrier are held in the associated lot region including 25 stages. In short, the fixed lot region mode means the mode in which the positions of the lot regions P1–P4 shown in FIG. 15 are fixed.

Contrary to this, in the variable lot region mode, the positions of the lot regions P1–P4 vary in accordance with a number of wafers held in one carrier associated with one lot or a number of lots (carriers) for a 1-batch operation. As shown in FIG. 4, the wafers-to-be-processed transfer mode setting unit 6 further comprises ten keys 63 and a central holding groove number display 64 (the 75th holding groove is displayed in FIG. 4). When the variable lot region setting mode switch 62 is pressed, a central holding groove number pressed by ten keys 63 to designate the holding groove number at the center of an arrangement of all wafers of one batch.

Figure 5:
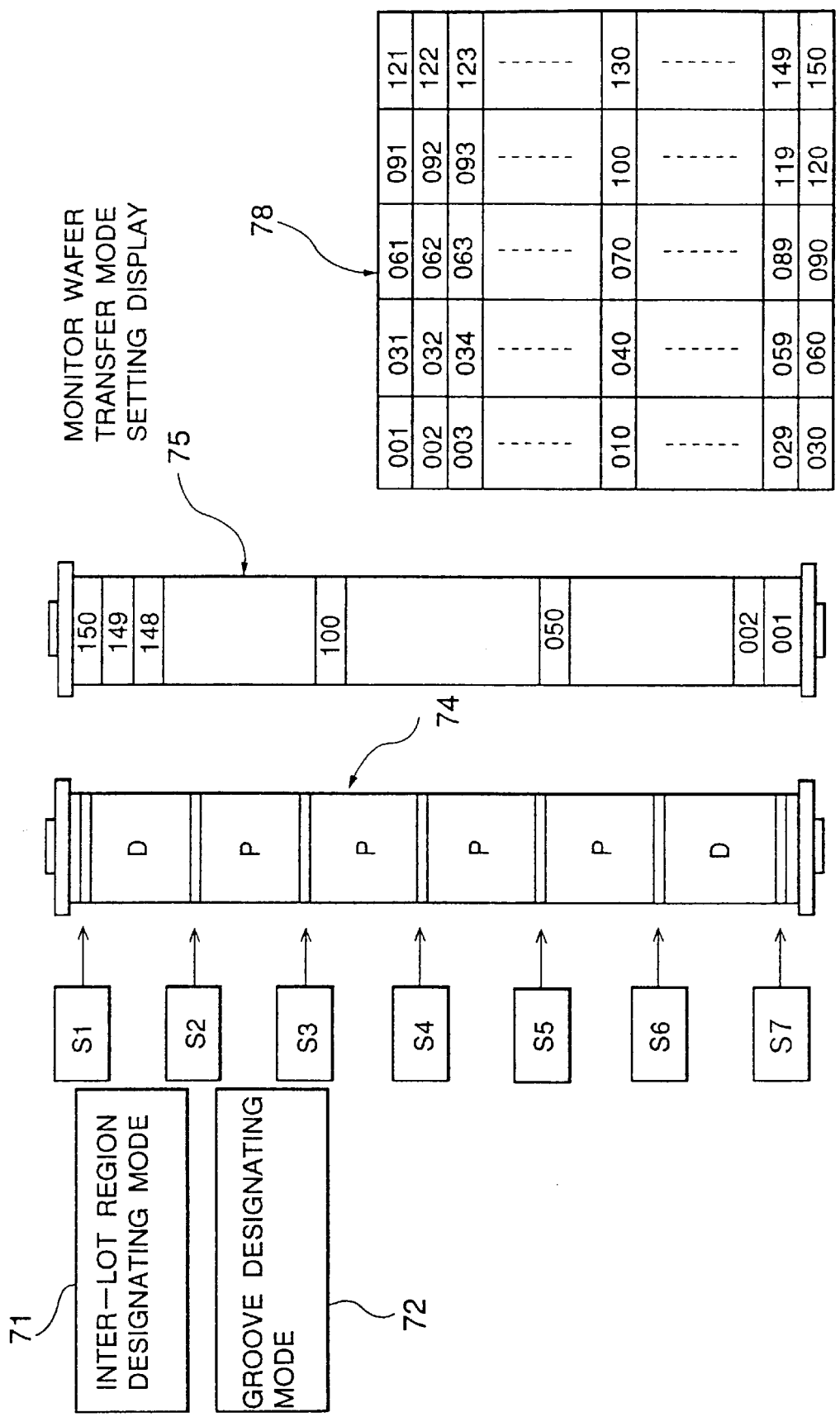
FIG. 5 is an explanatory view of a monitor wafer transfer mode setting display.

FIG. 5 shows one example of the operational display corresponding to the monitor wafer transfer mode setting unit 7. The monitor wafer transfer mode setting unit 7 includes an inter-lot region designating mode switch 71 and a groove designating switch 72. The monitor wafer transfer mode selecting unit 73 in FIG. 3 comprises the monitor wafer transfer selecting unit 73. On the operational display, the wafer boat 23 is displayed in two diagrammatic views indicated by reference numerals 74 and 75. In one 74 of the diagrammatic views of the wafer boat, four lot regions P, and dummy wafer holding regions D on the upper and the lower ends are shown.

As shown in FIG. 5, on the side immediately next to the diagrammatic view 74 of the wafer boat, switches S1–S7 corresponding to an inter-lot region designating unit 76 in FIG. 3 are displayed corresponding to respective inter-lot regions P, regions between the lot regions and the dummy wafer holding regions D, and both ends of the dummy wafer holding regions D. The switches S1–S7 are pressed to designate their associated positions, and are used when the inter-lot region designating mode has been selected. "Designation of the inter-lot regions" covers not only the inter-lot regions P between the lots of wafers to be processed, but also the regions between the lot regions and the dummy wafer holding regions D. In this example, however, the region above the upper dummy wafer holding region D, and the region below the lower dummy wafer holding region D can be designated by their associated switches S1, S7.

In FIG. 5, the diagrammatic view 75 of the wafer boat next to the diagrammatic view 74 displays positions and ordinal numbers of the holding grooves of the wafer boat. On the side of the diagrammatic view 75 switches 78 corresponding to a groove designating unit 77 in FIG. 3 are displayed. When the holding groove designating mode 72 is selected, switches 78 are pressed at their associated territories therearound, so as to designate the positions of the holding grooves of the diagrammatic view 75 of the wafer boat corresponding to the pressed switches 78.

On the other hand, the storing unit 8 in FIG. 3 stores a fixed lot region mode program 81 and a variable lot region mode program 82 to be used when the wafer-to-be-processed transfer mode is the fixed lot region mode or the variable lot region mode, and an inter-lot region designating mode program 83 and a groove designating mode program 84 to be used when the monitor wafer transfer mode is the inter-lot region designating mode or the holding groove designating mode is selected.

Then, the operation of the heat treatment apparatus according to the first embodiment of the present invention will be explained. First, a case in which monitor wafers are used as product monitor. As the wafer-to-be-processed transfer mode, the switch 61 on the operational display shown in FIG. 4 is pressed to select the fixed lot region mode, as the monitor transfer mode switch 72 on the display shown in FIG. 5 is pressed to select the inter-lot region designating mode 71, which is a relative position designating mode, and the switches S2–S5 are pressed to designate holding positions of the monitor wafers.

Figure 6:
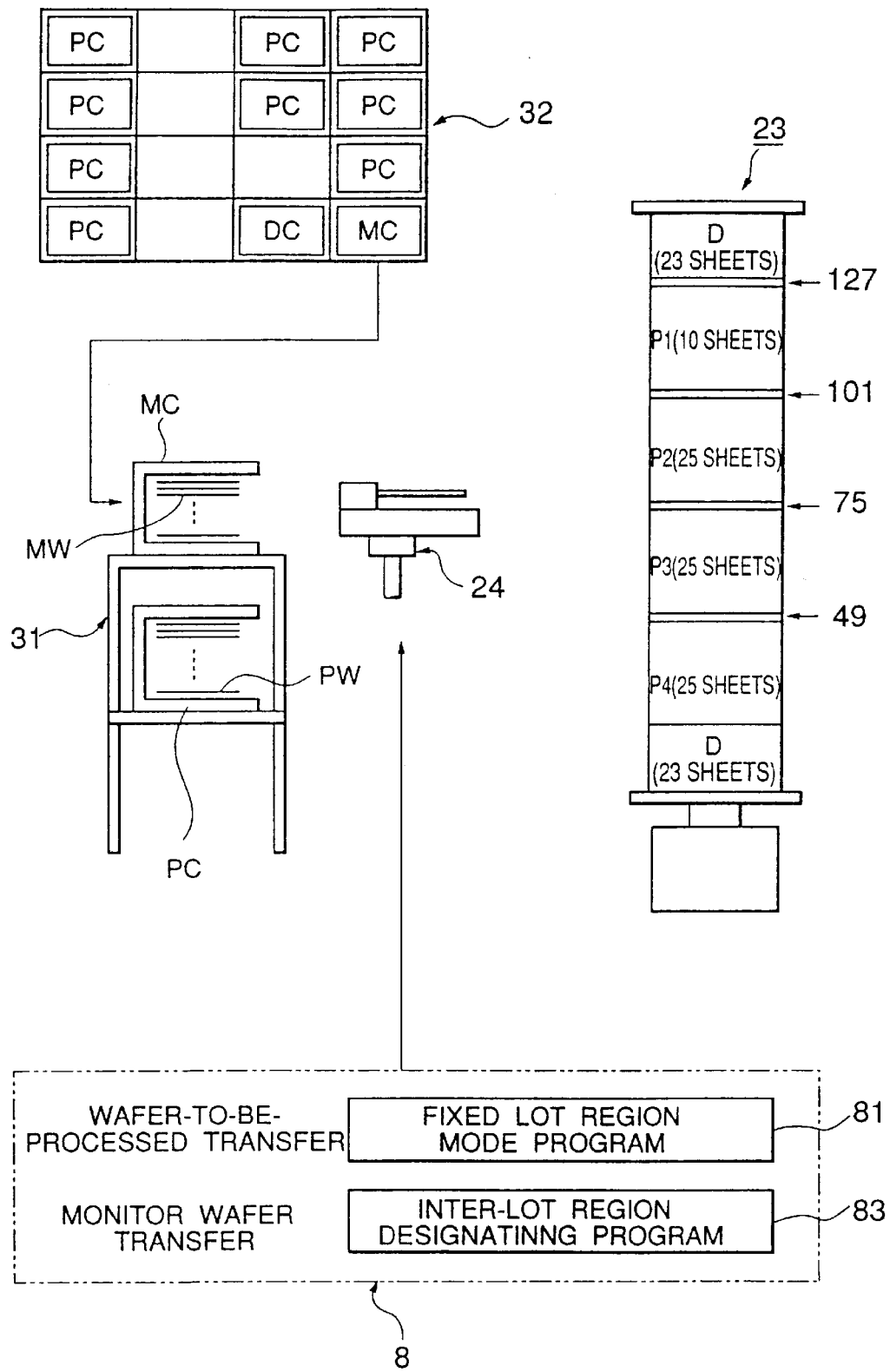
FIG. 6 is an explanatory view of an operation of the heat treatment apparatus according to the first embodiment.

On the other hand, as shown in FIGS. 1 and 2, the carriers C holding wafers carried into the carrier stages 33 are carried by the carrier transfer mechanism 4 to the delivery stage 31 directly or after stored on the carrier storing shelf 32. Then the wafers W are taken out of the carriers C on the delivery stage 31 to be transferred to the wafer boat 23 by the wafer transfer mechanism 24. FIG. 6 is a view explaining the method of transferring wafers to be processed PW and monitor wafers MW to the wafer boat 23. In FIG. 6, PC represents a carrier for wafers to be processed, and MC represents a carrier for monitor wafers, which is an exclusive storing unit for monitor wafers.

Here when it is assumed that the carriers PC storing wafers-to-be-processed PW which will be heat treated each hold 25 sheets, the wafers-to-be-processed in the four respective wafer carriers PC are transferred respectively to the lot regions P1–P4. In the dummy wafer holding regions D on the upper and the lower ends of the wafer boat 23, however, dummy wafers are arranged.

Monitor wafers MW are transferred by the wafer transfer mechanism from the carrier MC to the positions (indicated by the double lines in FIG. 6) in the wafer boat 23 designated by the switches S2–S5, i.e., to the positions between the lot regions P1–P4, and between the lot region P1 and the upper dummy wafer holding region D. The figures on the right side of the wafer boat indicate ordinal number of holding grooves in which the monitor wafers are held.

After the transfer of the wafers W to the wafer boat 23 is completed, the wafer boat 23 is lifted and loaded into the heat treatment furnace 21, and a required heat treatment, such as oxidation, CVD, diffusion or others, is conducted on the wafers W there. Then, the wafer boat 23 is lowered and unloaded out of the heat treatment furnace 21, and the wafers W are transferred by the wafer transfer mechanism 24 from the wafer boat 23 to the carriers C in the wafer transfer stage 31. The carriers C holding the treated wafers W are stored in the carrier storing shelf 32 or transferred directly to the carrier stage 33, in accordance with vacancy of the carrier storing shelf 32. The monitor wafers MW are sent to inspection steps for its inspection, and treated states of the wafers PW associated with the monitor wafers MW, e.g., the wafers PW in the lot regions immediately below the monitor wafer region W are known through the monitor wafers MW.

Here in a case that wafers to be processed W in the respective carriers PC are less than 25 sheets, and the fixed lot region mode is selected as the wafer transfer mode, numbers of the holding grooves corresponding to numbers of absent wafers-to-be-processed are vacant, or supplemental wafers are transferred by the carrier (not shown) to fill the vacant holding grooves. Accordingly the holding positions of the monitor wafers MW are fixed irrespective of numbers of the wafers to be processed PW in the carriers PC.

Then, a case that the monitor wafer transfer mode is set as described above, and as the wafer transfer mode, the variable lot region mode is selected by pressing the variable lot region setting mode switch 62 on the operational display of FIG. 4 will be explained. First, when the four carriers PC hold respectively 25 sheets of wafers to be processed PW, the arrangement of the wafers PW and the monitor wafers MW on the wafer boat 23 is quite the same as described above. When numbers of wafers PW in the respective carriers PC are less than 25 sheets, the wafers PW are transferred as will be described below.

Figure 7:
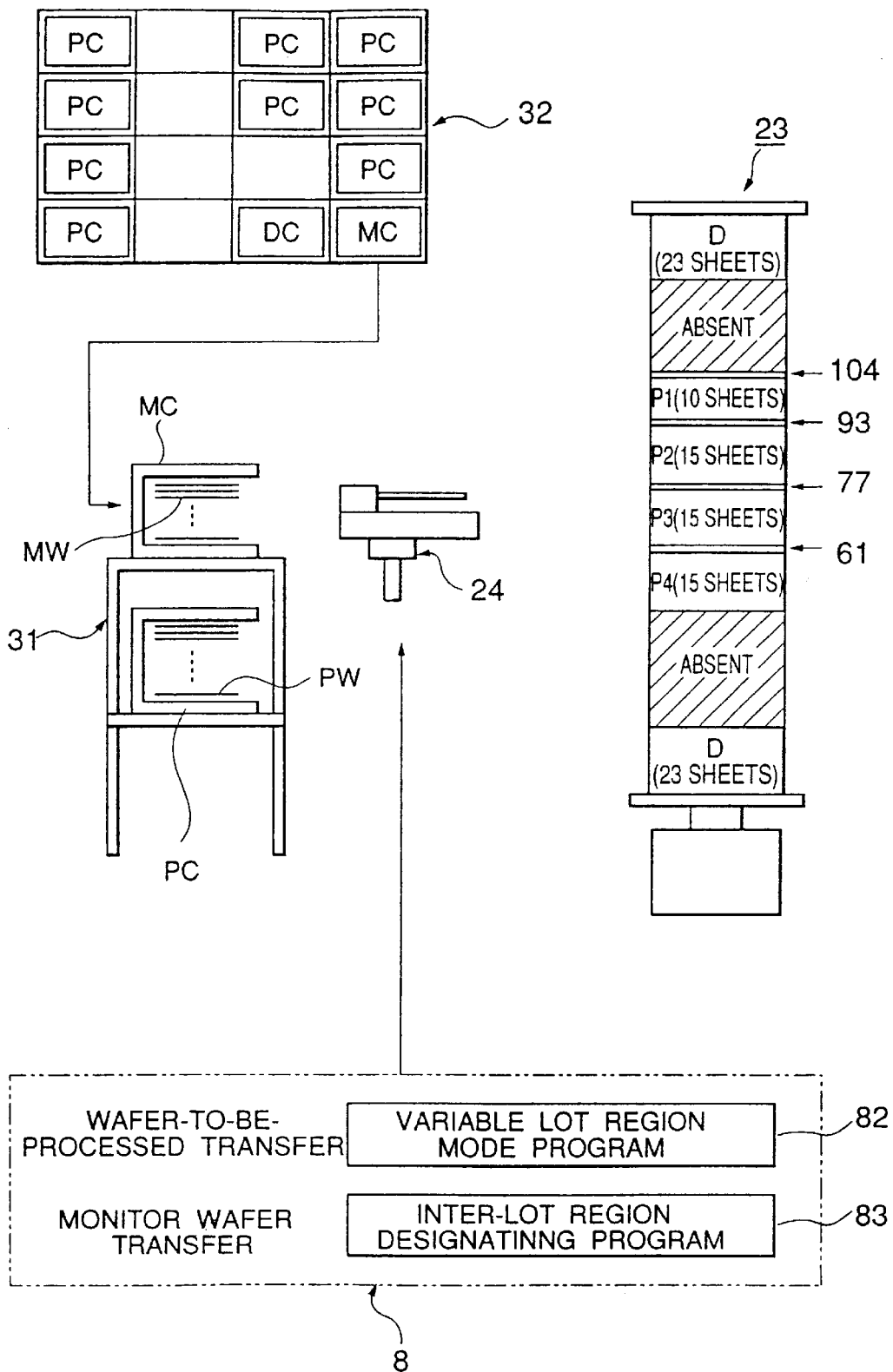
FIG. 7 is an explanatory view of an operation of the heat treatment apparatus according to the first embodiment.

A holding groove number at the center position is set at the groove number [75], for example, on the operational display of FIG. 4. As shown in FIG. 7, the wafers PW in all the four carriers PC are concentrated upper and lower of the 75th holding groove of the wafer boat 23. That is, the wafers PC are so concentrated that holding grooves associated with absent wafers PW of the respective carriers PC are not vacant. When a total number of wafers PW is even, the wafers PW are arranged with the center position being at $(n/2+1)$ or $(n/2-1)$. In the example shown in FIG. 7, 10 sheets, 15 sheets, 15 sheets and 15 sheets of wafers PW are held respectively in the four carriers PC, and all the wafers are arranged upper and lower of the 75th holding groove at the center position. The lot regions P1–P4 are changed from those shown n FIG. 6 in the holding region in the wafer boat 23. In this case, the inter-lot regions (indicated by the double lines) designated by the switches S2–S6 are changed apparently in comparison with those shown in FIG. 6. Monitor wafers MW are transferred to the thus-determined inter-lot regions and are subjected to the same heat treatment.

Figure 8:
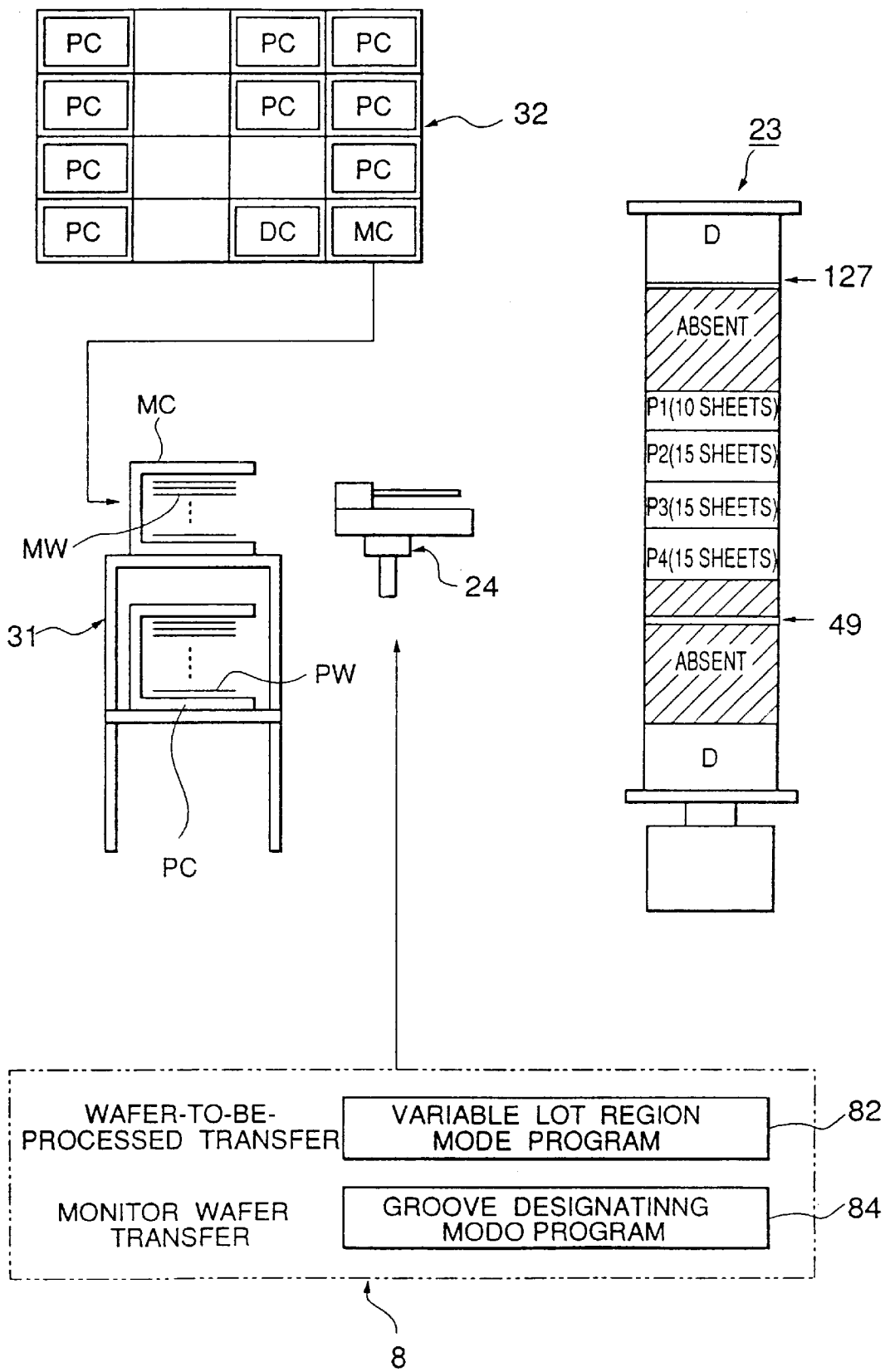
FIG. 8 is an explanatory view of an operation of the heat treatment apparatus according to the first embodiment.

Then a case that monitor wafers MW in the monitor wafer carrier MC are used as apparatus monitor wafers will be explained. Apparatus monitor is conducted once per preset times of the batch processing, e.g., four times. It is unnecessary to conduct the product monitor especially every time as long as the heat treatment apparatus is stable. When the apparatus monitor is conducted, the monitor wafer transfer position setting mode is selected by pressing the switch 72 on the operational display of FIG. 5, and further numbers of holding groove in which the monitor wafers MW are to be held are designated by the holding groove number designating mode. FIG. 8 shows the transferred state of wafers on the wafer boat 23 in a case that the transfer mode of the wafers to be processed PW is the same as exemplified in FIG. 7, and the monitor wafers are held on the [127th stage] and the [49th stage].

By this setting, monitor wafers MW can be transferred to holding grooves of the wafer boat of designated groove numbers irrespective of a number of lots and a number of wafer sheets in one lot whether a wafer-to-be-processed transfer mode is the fixed lot region mode or the variable lot region mode, and holding positions of the monitor wafers MW are always fixed. In a case that the fixed lot region mode is continuously used as the wafer-to-be-processed transfer mode, or the four carriers each holding 25 sheets of wafers PW are continuously treated, the inter-lot region designating mode may be selected because selected holding positions of the monitor wafers are fixed for each batch treatment.

According to the above-described first embodiment, in a case that numbers of wafers-to-be-processed PW in the respective carriers PC are less than 25 sheets, or three or less lots are used for one batch treatment, that is, in a case that a smaller number of wafers than a holding capacity of the wafer boat 23 is treated, the variable lot region mode is selected, whereby regions of the holding regions in the wafer boat 23, which are selected, e.g., regions having high intra-surface homogeneity of a heat treatment can be set.

In setting holding positions of monitor wafers, either of the inter-lot region designation which determines the holding positions corresponding to lot regions, in other words, designates positions relative to the lot regions, and the groove designating mode which determines holding grooves which are absolute positions on the wafer boat 23, whereby even when wafers to-be-processed PW are transferred in the variable lot region mode, holding positions of monitor wafers MW on the wafer boat can be fixed for each batch treatment.

Accordingly, in conducting product monitor, product monitor wafers can be positioned near the respective lots by selecting the inter-lot region designating mode. On the other hand, in conducting apparatus monitor, apparatus monitor wafers can be held at fixed positions by selecting the groove designating mode. Thus, the product monitor wafers can accurately monitor treated states of the wafers of the lots to be monitored by the product monitor wafers. The apparatus monitor wafers have fixed monitoring positions in the heating furnace, whereby the monitor can be of high reliability and can quickly find deterioration of the heater.

In transferring product monitor wafers to the wafer boat 23, the groove designating mode may be used. The product monitor wafers and the apparatus monitor wafers may be of the same kind or different kinds (for example, the apparatus monitor wafers may have special electrodes buried in). In the variable lot region mode, in place of setting a designated holding groove at a center position, it is possible, for example, that a designated holding groove is set at an upper end position, and wafers to be processed may be arranged below the upper end position. A mode for holding monitor wafers at fixed position relative to lot regions is not essentially limited to the inter-lot region designating mode and may be a mode for holding monitor wafers at prescribed positions in lot regions.

In place of setting wafers of one carrier as one lot, wafers of 2 or more carriers may be set as one lot. A maximum number of lots in the wafers-to-be-processed holding region of the wafer boat is not limited to the four lots in the first embodiment. The present invention is not essentially applied to vertical heat treatment furnaces as described in the first embodiment and may be applied to horizontal heat treatment apparatuses.

According to the present invention, holding positions for monitor substrates on the holding means (wafer boat) can be set corresponding to lots or may be set as absolute positions. As a result, the apparatus can have operationality a high degree of freedom. For example, product monitor wafer substrates and apparatus monitor wafers can be positioned in accordance with their purposes, and both product monitor and apparatus monitor can have high reliability.

According to the present invention, securing the above-described advantageous effects, the advantage that the transfer of substrates to be processed onto the holding means can have a high degree of freedom.

A Second Embodiment

Next, a heat treatment apparatus according to a second embodiment of the present invention will be explained. This heat treatment apparatus has substantially the same structure as the heat treatment apparatus according to the first embodiment shown in FIGS. 1 and 2, and its structure will not be explained here.

The heat treatment apparatus according to the second embodiment includes a transfer mode setting unit 60 which sets arrangements of wafers to be processed on the wafer boat 23 shown in FIG. 1.

Figure 10:
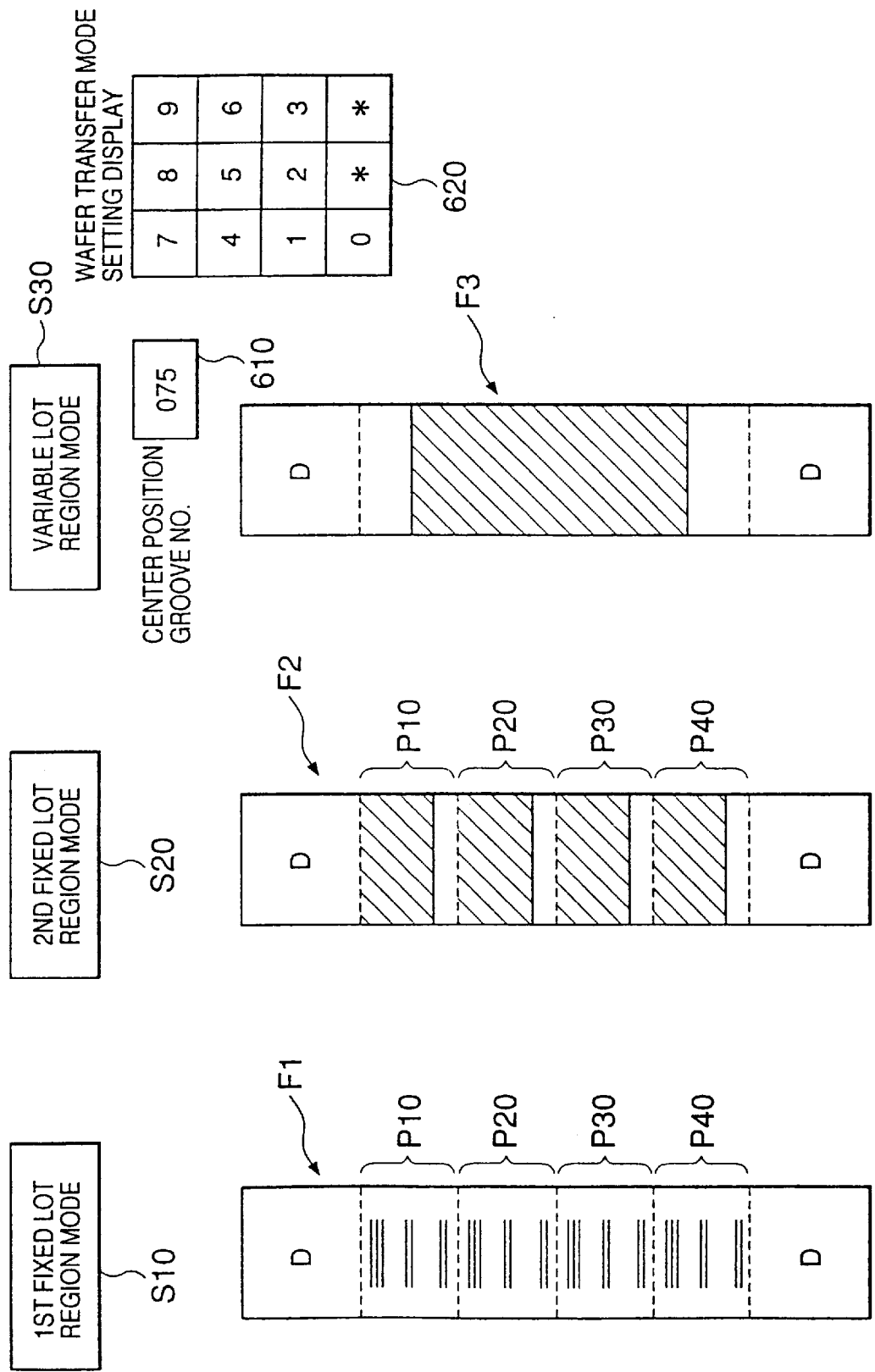
FIG. 10 is an explanatory view of a wafer-to-be-processed transfer mode setting display of the heat treatment apparatus according to the second embodiment.

FIG. 10 shows one example of the operational display of the wafer transfer mode setting unit 60. This display includes a switch S10, S20, S30 for respectively setting a first fixed lot region mode, a second fixed lot region mode and a variable lot region mode. Below the respective switches S10–S30 are shown diagrammatic views F1, F2, F3 of the respective transfer modes. Both in the first and the second fixed lot region modes, lot regions are allocated to respective lots in the wafer holding region of the wafer boat 23, and wafers-to-be-processed of the respective lots are transferred to their respective lot regions.

In a case, for example, that the wafer boat 23 has 150 stages of holding grooves, and dummy wafers are held in the upper and the lower 25 stages with wafers to be processed held (on the 100 stages) between the dummy wafers, four sections each including 25 stages correspond to lot regions P10–P40. One carrier corresponding to one lot holds 25 sheets of wafers to be processed. In a case that one carrier holds 25 sheets of wafer to be processed, and a number of wafers to be processed held in one carrier is less than 24 sheets or less than 24 sheets are held in one lot region. That is, the first and the second fixed lot region modes are modes in which positions of the lot regions P10–P40 are fixed on the wafer boat 23. Differences between both modes will be explained. In the first fixed lot region mode, wafers to be processed in the respective lot regions P10–P40 are transferred in accordance with an arrangement of the wafers in the carriers. That is, in this mode, unless numbers of wafers to be processed in the respective carriers are less than 25 sheets, and the carriers have vacant holding grooves, pincettes 24a of a wafer transfer mechanism 24 for 25 sheets of wafer to be processed are advanced into the carriers, receive the wafers and transfer the wafers onto the wafer boat 23. Stages of holding grooves of the wafer boat 23 are vacant corresponding to vacant grooves in the carriers.

The second fixed lot region mode is a mode in which whether or not carriers have vacant holding grooves, wafers to be processed in the respective lots (carriers) are transferred onto the associated lot regions P10–P40 to be arranged one immediately after another from, e.g., the top without vacant holding grooves therebetween. In this mode, the wafer transfer mechanism shown by F1 does not essentially transfer five wafers-to-be-processed collectively by five pincettes, and when vacant holding grooves are present between one of the five holding grooves and its adjacent one, the wafers are transferred by one by one pincettes 24*a*. In the drawing indicated by F1 on the operational display, the horizontal solid lines indicate wafers to be processed, and in the drawing indicated by F2, the slant lines indicate groups of wafers to be processed, and D indicates dummy wafer regions.

On the other hand, in the variable lot region mode, positions of the lot regions P10–P40 are changed in accordance with a number of wafers to be processed in one carrier associated with one lot, or a number of lots (carriers). That is, all wafers to be processed are arranged without vacant holding grooves therebetween on both sides of a designated standard position. Immediately below a switch of the variable lot region mode S30 there is disposed a holding groove indicating part 610 (here indicating Groove No. 75) which is to be a standard position, e.g., a center position of a wafer group. Ten keys 620 are disposed near the holding groove indicating part 610 for indicating a groove number at a center position.

Then, a control unit of the heat treatment apparatus according to the second embodiment of the present invention will be explained with reference to FIG. 9.

Figure 9:
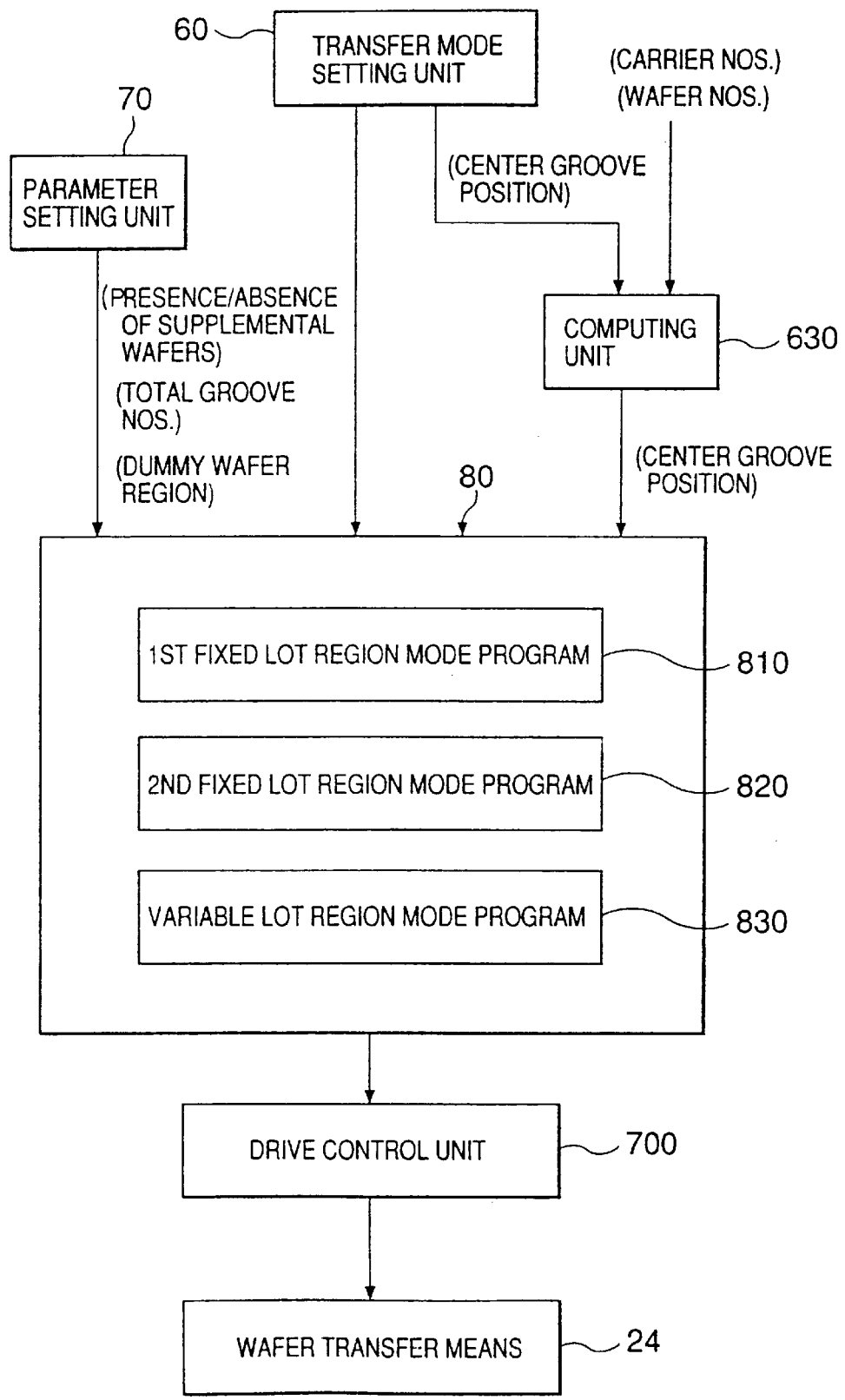
FIG. 9 is a block diagram of a wafer transfer mode setting unit of the heat treatment apparatus according to a second embodiment of the present invention.

As shown in FIG. 9, the heat treatment apparatus according to the second embodiment comprises a computing unit 630, a parameter setting unit 70, a memory unit 80 and a drive control unit 700. A number of carriers, numbers of wafers-to-be-processed in the respective carriers, a total holding grooves of the wafer boat 23, and dummy wafer regions (a number of dummy wafers to be held) are inputted to the computing unit 630 and judges whether or not a groove number at a center position, which is designated when the variable lot region mode is selected, i.e., whether or not the wafers to be processed correspond to a holding region for the wafers to be processed except the dummy wafer regions. The computing unit 630 has the function that when the designation is not proper and erroneous, the unit 630 computes and automatically designates a groove number at a center position so that the wafers to be processed are held in the wafer-to-be-processed holding region.

The parameter setting unit 70 comprises an operational display on an operational panel 5 indicated by F1, and outputs a total holding grooves of the wafer boat 23, presence/absence (use/non-use) of the dummy wafer regions and supplemental wafers and sets various parameters, such as presence/absence of monitor wafers. The memory unit 80 stores programs 810, 820, 830 corresponding to modes set by the transfer mode setting unit 60. The drive control unit 700 drive controls the wafer transfer mechanism 24, based on a program selected by the memory unit 80, and comprises a CPU and a motor control circuit. In the second embodiment, the memory unit 80 and the drive control unit 700 constitute a part of the control unit for controlling the wafer transfer mechanism 24, based on a selected transfer mode.

Then, the operation of the second embodiment of the present invention will be explained. First, a case that the switch S10 in the wafer transfer mode setting display of FIG. 10 is pressed to select the first fixed lot region mode will be explained. The carriers C containing wafers are carried to the carrier stage 33 as shown in FIGS. 1 and 2, the carriers are carried to the wafer transfer stage 31 after temporarily stored in the carrier storing shelf 32 by the carrier transfer mechanism 4 or directly from the carrier stage 33. Then wafers are taken out of the carriers C placed on the wafer transfer stage 31 by the wafer transfer mechanism 24 to be transferred to the wafer boat 23.

Figure 11:
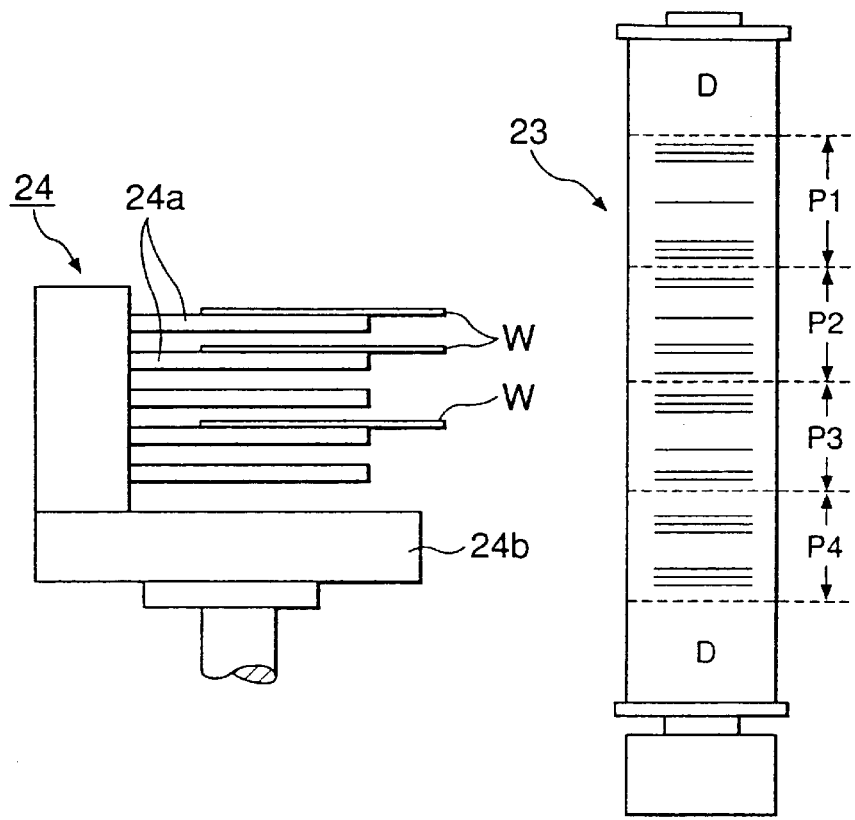
FIG. 11 is an explanatory view of transfer of wafers-to-be-processed when the first fixed lot region mode is selected in the second embodiment of the present invention.

In this mode, the wafers are transferred, based on the first fixed lot region mode program 810 shown in FIG.9. That is, the wafer groups in the four carriers C are transferred respectively to the lot regions P10–P40 of the wafer boat 23. In this case, as shown in FIG. 11, the five arms 24*a* of the wafer transfer mechanism 24 are concurrently driven to transfer the wafers W. Accordingly as described above, the carriers have absent wafers, the holding grooves of the wafer boat 23 corresponding to the absent wafers are vacant.

Here when the parameter setting unit 70 (see FIG. 9) is set to use supplemental wafers, supplemental wafers are supplied to the vacant stages of the wafer boat 23, and when no supplemental wafers are used, the vacant stages of the wafer boat are left vacant. Supplemental wafers are used for prohibiting changes of a gas flow caused by the vacant stages and are not used in, e.g., annealing, which is susceptible to gas flows. In CVD, etc., modes which do not use supplemental wafers may be set. After wafers are thus mounted on the wafer boat 23, the wafer boat 23 is loaded into the heat treatment furnace 21 shown in FIG. 1, and a heat treatment, e.g., annealing is conducted on the wafers. Then, the wafer boat 23 is lowered to be unloaded out of the heat treatment furnace, and the wafers W are transferred back to the carriers C.

The parameter setting unit 70 shown in FIG. 9 may set the use of monitor wafers. In this case, monitor wafers for monitoring treatment conditions of the wafers to be processed are transferred from, e.g., exclusive carriers to four positions, e.g., one stage above the lot region P10, and between the lot regions P10 and P20, between the lot regions P20 and P30, between the lot region P30 and P40. Accordingly positions of the lot regions P10–P40 are a little displaced from each other depending on the cases in which monitor wafers are used and are not used. But in the fixed lot region mode, the lot regions are fixed in both cases that monitor wafers are used and are not used, irrespective of numbers of sheets of wafers to be processed.

Figure 12:
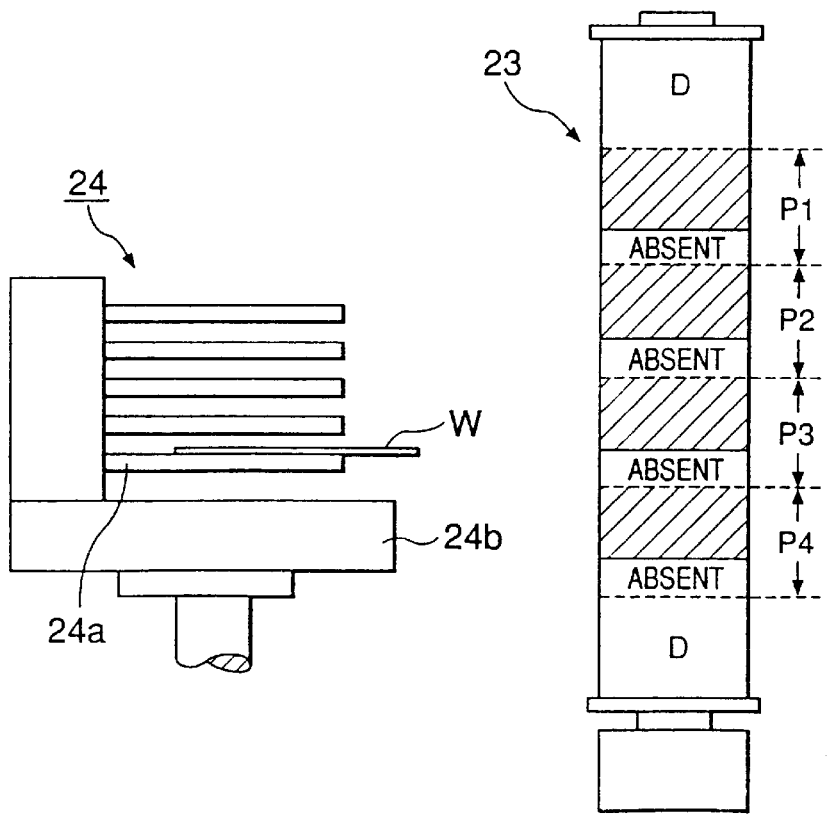
FIG. 12 is an explanatory view of transfer of wafers-to-be-processed when the second fixed lot region mode is selected in the second embodiment of the present invention.

In a case that the second fixed lot region mode is selected, the following takes place. That is, as described above, when five sheets of wafers to be processed are arranged without vacant holding grooves, the wafers are simultaneously transferred to the wafer boat 23 by the 5 pincettes 24*a* of the wafer transfer mechanism shown in FIGS. 11 and 12. But when even one of the five stages of the holding grooves is vacant, only the lowermost one of the pincettes 24*a* is used to transfer the wafers one by one to the wafer boat 23. Groups of wafers to be processed in the four carriers are transferred to their associated lot regions P10–P40, but the wafers in each carrier are transferred first to the top stage of holding grooves in the associated lot region and sequentially to the next below stage, i.e., are held on an upper side of the associated lot region. Accordingly a number of the holding grooves corresponding to a number of vacant grooves of each carrier are vacant below the group of the wafers in the associated lot region. In both the first and the second fixed lot region modes, when three or less than three carriers are used, the lot regions P10, P20, P30, for example, are designated to use the designated lot regions.

Figure 13:
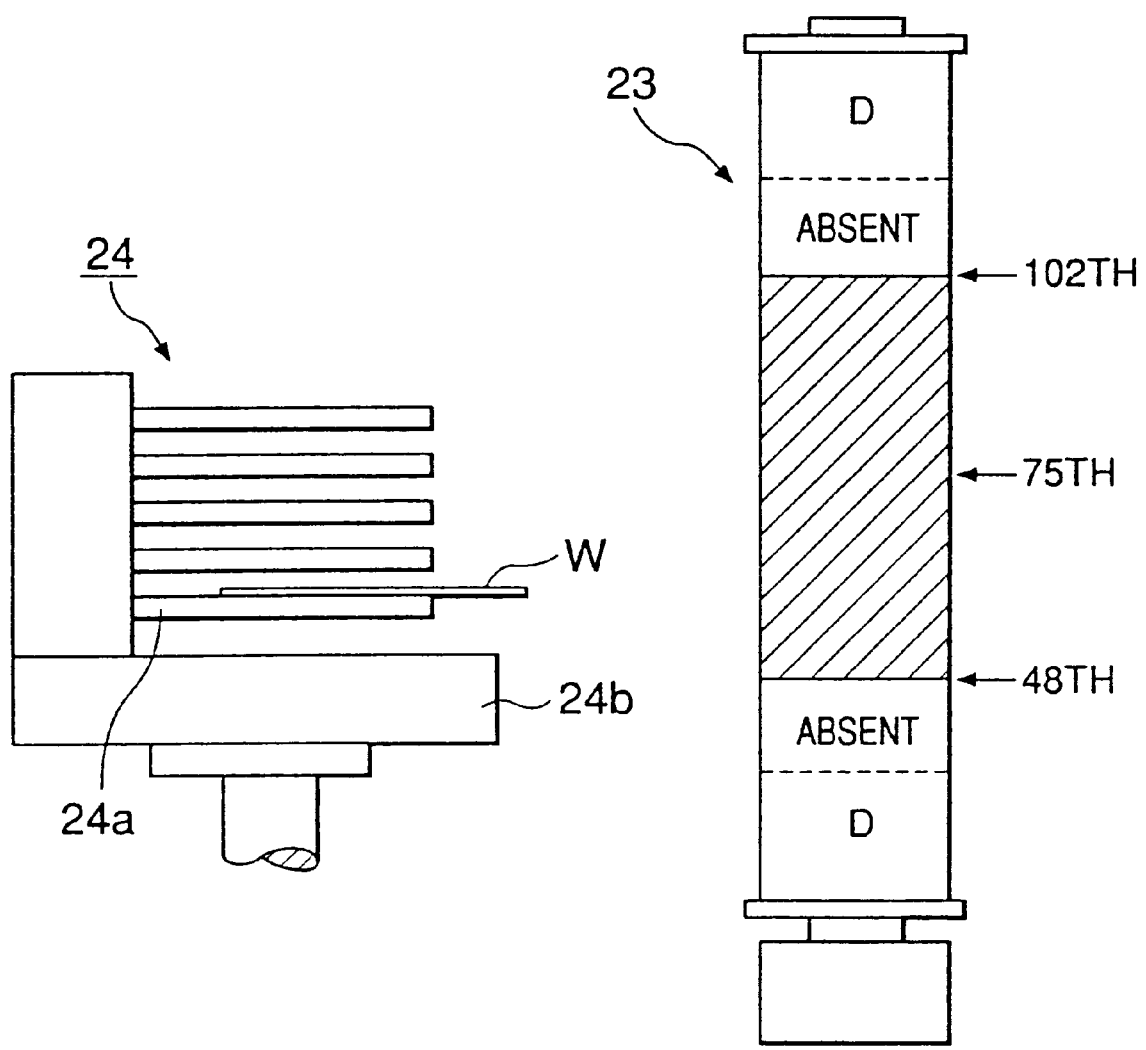
FIG. 13 is an explanatory view of transfer of wafers-to-be-processed when the variable lot region mode is selected in the second embodiment of the present invention.

Then, a case that the variable lot region mode is selected by pressing the switch S 30 on the transfer mode setting display of FIG. 10, and a groove number [75], for example, is designated as the center position will be explained. In this case, as in the second fixed lot region mode, the pincettes 24a of the wafer transfer mechanism 24 are changed depending on presence/absence of vacant grooves in the respective carriers. As shown in FIG. 13, wafers to be processed in each carrier C are arranged on upper and lower stages of the 75th holding groove without vacant grooves therebetween. But when a total wafers to be processed are even, the wafers are arranged so that (n/2+1) or (n/2−1) is positioned at a holding groove number at a center position.

FIG. 13 exemplifies a case that the four carriers C respectively hold 10 sheets, 15 sheets, 15 sheets and 15 sheets of wafers to be processed, and the total 55 sheets of wafers are arranged on the upper and the lower sides of the 75th stage of the holding grooves, i.e., the wafers are arranged in the order of the lots between the 48th stage and the 102th stage. In this case, vacant stages are present between the wafer-to-be-processed holding region and the dummy wafer regions D, and the vacant stages are left vacant or filled with supplemental wafers, depending on treatments. Here the computing unit 630 in FIG. 9 judges whether or not the designated holding groove number at the center position is correct. When the designation is not correct (erroneous), the computing unit 630 corrects the designation so that all the wafers to be processed are held in the wafer-to-be-processed holding region. For example, when the wafer-to-be-processed holding region is from the 26th stage to the 125th stage, and a center position for a totally 55 sheets of wafers to be processed is designated on the 100th stage (holding groove number 100), the wafers-to-be-processed are intruded into the upper dummy wafer region D. The center position is automatically corrected to the 98th stage so that the uppermost wafer to be processed is located on the 125th stage.

According to the second embodiment, when the variable lot region mode is set, wafers to be processed are arranged on the upper and the lower sides of a holding groove of the holding means 23 at a center position without vacant holding grooves therebetween, whereby in cases that wafers to be processed are absent in the carriers or in the lots, the groups of the wafers are located in regions having better characteristics of the apparatus, such as temperature distribution, etc. In addition, wafers to be processed and supplemental wafers are held divided from each other, whereby contamination of the wafers to be processed by the supplemental wafers can be decreased, and in this case, a standard position may be designated at an upper or a lower end of a group of the wafers to be processed. By designating a center position, a holding groove position corresponding to a center of a region having better temperature distribution irrespective of numbers of sheets of wafers to be processed is designated, whereby a group of the wafers to be processed is efficiently located in the region, and designation of a standard position is easy. Conveniently a standard position can be automatically corrected when a erroneous designation by which wafers to be processed are beyond a set region is made.

Furthermore, when the first or the second fixed lot region mode is set, the lot regions in the wafer boat 23 is fixed irrespective of numbers of wafers to be processed, whereby in analyzing wafers to be processed after a heat treatment, the carriers and the holding regions in the wafer boat 23 correspond to each other, which makes it easy to identify a holding region in the wafer boat 23, based on the carriers and accordingly analyze the wafers to be processed. In the first fixed lot region mode, the fixed pincettes 24a are operated at once to transfer a plurality of wafers to be processed whether or not wafers are absent in the carriers, whereby the transfer can be easy and quick. In the second fixed region mode, wafers to be processed and supplemental wafers can be divided in each lot region, whereby contamination of the wafers to be processed can be suppressed.

As described above, according to the second embodiment of the present invention, the wafer transfer mode includes three modes, and has high freedom degree. The modes can be suitably selected depending on states of the apparatus (whether or not the apparatus has a stable state), kinds of heat treatments, kinds of wafers to be processed, etc., and the wafers can be suitably treated.

In the present invention, a maximum lot number accommodated in the wafer-to-be-processed holding region is not limited to 4 lots, and the heat treatment can include various treatments, such as CVD, oxidation, diffusion, etc. The present invention is not essentially applied to the vertical heat treatment apparatus described in the second embodiment, but is applicable to horizontal heat treatment apparatuses.

According to the present invention, as the wafer-to-be-processed transfer mode, the variable lot region mode can be selected, whereby when a lot number of one batch or a number of sheets of wafers to be processed is less than a prescribed number, the wafers to be processed can be heat treated in a region having better characteristics as a heat treatment apparatus. According to the present invention, a transfer mode is selected out of the variable lot region mode, and the fixed lot region modes, e.g., the first and the second fixed lot region modes, whereby a heat treatment can be conducted by a suitable transfer mode in accordance with a state of the heat treatment apparatus and kind of heat treatments.

What is claimed is:

1. A heat treatment apparatus for holding a plurality of substrates-to-be-processed in a holding means, side by side, in a unit of lot and for taking monitor substrates out of an exclusive storing unit by a transfer means and transferring the monitor substrates to the holding means, loading the holding means into a reaction tube of a heating furnace to make a heat treatment on the monitor substrates concurrently with the substrates-to-be-processed, the heat treatment apparatus comprising:

monitor substrate transfer mode selecting means for setting a relative position designating mode and an absolute position designating mode and selecting either of the modes, the relative position designating mode being for allocating lot regions which are substrate-to-be-processed holding regions of lots of one batch processing to a substrate holding region of the holding means, and designating relative positions for monitor substrates, based on the lot regions, and holding the monitor substrates there, the absolute position designating mode being for designating ordinal numbers of stages in the substrate holding region of the holding means and holding the monitor substrates there, relative position designating means for designating holding positions of the monitor substrates corresponding to the lot regions when the relative position designating mode is selected; and absolute position designating means for designating ordinal numbers of stages of holding positions of the monitor substrates when the absolute position designating mode is selected.

2. A heat treatment apparatus for holding a plurality of substrates-to-be-processed in a holding means, side by side, in a unit of lot and for taking monitor substrates out of an exclusive storing unit by a transfer means and transferring the same to the holding means, loading the holding means into a reaction tube of a heating furnace to make a heat treatment on the monitor substrates concurrently with the substrates-to-be-processed, the heat treatment apparatus comprising:

substrate-to-be-processed transfer mode selecting means for setting a fixed lot region mode and a variable lot region mode, and selecting either of the modes, the fixed lot region mode being for allocating lot regions for respective lots to a substrate holding region of the holding means, and transferring substrates-to-be-processed of the respective lots to the associated lot regions, the variable lot region mode being for designating an ordinal number of a stage in the substrate holding region of the holding means as a standard position, and transferring the substrates-to-be-processed of all the lots involved in one batch processing to the holding means without a vacant stage therebetween;

monitor substrate transfer mode selecting means for setting a relative position designating mode and an absolute position designating mode, and selecting either of the modes, the relative position designating mode being for designating relative positions based on the allocated lot regions, and holding monitor substrates there, the absolute position designating mode being for designating ordinal numbers of stages of holding positions in the holding region of the holding means;

relative position designating means for designating the lot regions to which the holding positions of the monitor substrates correspond, when the relative position designating mode is selected; and absolute position designating means for designating ordinal numbers of stages of the holding positions of the monitor substrates when the absolute position designating mode is selected.

3. The heat treatment apparatus according to claim 1, wherein the relative position designating means is inter-lot region designating means for designating inter-lot regions to which the holding positions of the monitor substrates correspond to.

4. The heat treatment apparatus according to claim 1, wherein the monitor substrates are either of product monitor substrates for monitoring treated states of the substrates to be processed or apparatus monitor substrates for monitoring states of the apparatus, the relative position designating mode is selected when the product monitor substrates are used in the monitor substrate transfer mode, and the absolute position designating mode is selected when the apparatus monitor substrates are used in the monitor substrate transfer mode.

5. The heat treatment apparatus according to claim 1, wherein said monitor substrate transfer mode selecting means includes a user interface to provide the selection of either the relative position designating mode or the absolute position designating mode.

6. The heat treatment apparatus according to claim 2, wherein said substrate-to-be-processed transfer mode selecting means includes a user interface to provide the selection of either the fixed lot region mode or the variable lot region mode.

* * * * *